United States Patent [19]
Conzelmann et al.

[11] Patent Number: 5,990,539
[45] Date of Patent: Nov. 23, 1999

[54] TRANSISTOR COMPONENT HAVING AN INTEGRATED EMITTER RESISTOR

[75] Inventors: Gerhard Conzelmann, Leinfelden-Echterdingen; Heinz Pfizenmaier, Leonberg; Wolfgang Appel, Schwieberdingen; Volker Dudek, Korntal-Münchingen; Helmut Schneider, München, all of Germany

[73] Assignee: Robert Bosch GmbH, Stuttgart, Germany

[21] Appl. No.: 09/129,376

[22] Filed: Aug. 5, 1998

[30] Foreign Application Priority Data

Aug. 13, 1997 [DE] Germany .................. 197 34 985

[51] Int. Cl.$^6$ .................. H01L 27/082; H01L 27/102; H01L 29/70; H01L 31/11
[52] U.S. Cl. .................. 257/577; 257/580; 257/581; 257/582
[58] Field of Search .................. 257/565, 577, 257/580, 581, 582, 588

[56] References Cited

U.S. PATENT DOCUMENTS 3,286,138 11/1966 Shockley .................. 257/581

FOREIGN PATENT DOCUMENTS 0 397 727 11/1990 European Pat. Off. .......... 257/565

OTHER PUBLICATIONS

R. Widlar et al., "A Monolithic Power Op Amp", IEEE Journal of Solid–State Circuits, vol. 23, No. 2, Apr. 1988, pp. 527–534.

*Primary Examiner*—Steven H. Loke
*Attorney, Agent, or Firm*—Kenyon & Kenyon

[57] ABSTRACT

A transistor component is suited for controlling large currents, even given high frequencies. The transistor component includes integrated emitter resistors which are arranged between partial-emitter regions and emitter-metal contacts. The integrated emitter resistors cause a stabilized, uniform current distribution both over the various partial-emitter regions, and within the partial-emitter regions, and bring about an improved current carrying capacity, as well as improved high-frequency properties, particularly in view of the finite magnitude of the extrinsic base resistance.

6 Claims, 2 Drawing Sheets

TRANSISTOR COMPONENT HAVING AN INTEGRATED EMITTER RESISTOR

BACKGROUND INFORMATION

European Patent Application No. 0 397 727 describes a power transistor which has resistors in the emitter leads to stabilize the distribution of the total current to the individual partial transistors. However, in this conventional power transistor, the emitter resistors are laterally offset with respect to the partial-emitter regions, and are neither in direct electrical, nor in direct thermal contact with the partial-emitter regions.

Furthermore, the article "A Monolithic Power Op Amp" by Robert J. Widlar and Mineo Yamataka in the IEEE Journal of Solid-State Circuits, Vol. 23, No. 2, April 1988 describes an insertion of an emitter resistor made of polysilicon in a plane provided extra for that purpose. The metal contacting of the emitter resistor, in electrical contact with the individual partial-emitter regions, is carried out at a location in common for all the partial-emitter regions, the metal contacting being laterally offset for contacting the emitter resistor to the partial-emitter regions.

SUMMARY OF THE INVENTION

A transistor component according to the present invention is advantageous in that a uniformly distributed current flow is ensured over partial emitter regions formed as emitter fingers. This allows longer emitter fingers and higher current densities, respectively. Particularly in the case of high-frequency power transistors, smaller recharge capacitances result, since (given required current carrying capacity) it is possible to use shorter emitter fingers, and since the current density is distributed uniformly over the emitter fingers.

Another advantage, due to the negative feedback in the emitter resistor, is the homogenization of the current density transversely to the base contact, which permits larger effective widths of the partial-emitter regions. Current displacement effects (emitter-crowding) are further reduced. The upper limit of the width of the emitter fingers as a result of the finite extrinsic base resistance is shifted to greater values. Optionally, in the case of high-frequency transistors, the Gummel number of the base can be reduced, i.e., a higher extrinsic base resistance can be accepted in order to increase the current carrying capacity of the high-frequency (drift) transistor. It is also advantageous for the ratio of the emitter edge to the emitter area to be smaller without resulting in a harmful capacitance increase. Thus, fewer partial transistors are necessary for the same current carrying capacity.

Furthermore, the arrangement of the emitter resistor precisely between the respective partial emitter and the metal contacting yields a compact type of construction of a power transistor.

Given thermal coupling between the emitter resistor and the partial-emitter region, it is also advantageous to select (for the emitter resistor) a material having essentially non-negative temperature coefficients. Thus, spatially-resolved compensation of the negative temperature coefficients of the base-emitter junction, depending on the local temperature, is rendered possible.

A suitable, compact implementation results by constructing the emitter resistors as mono-crystalline semiconductor layers.

An optimized design as to the tolerance with regard to high extrinsic base resistances is yielded by adapting the emitter-resistor widths to the partial-emitter widths.

By suitably selecting the thickness of the emitter-resistor semiconductor layer, and by suitably selecting the doping concentration, the emitter resistors can be realized in a space-saving manner.

The suitable selection of the material, the conductivity type and the dopant for the emitter-resistor semiconductor layer yields an integrated design that is simple to implement.

Contacts free of barrier layers (e.g., junctions) for the transistor component according to the present invention is further advantageous.

A decoupling (tapping) resistor for gaining a voltage proportional to the emitter current can be integrated in an elegant manner, so that information can be obtained about the emitter current without additional voltage loss.

DETAILED DESCRIPTION

Figure 1:
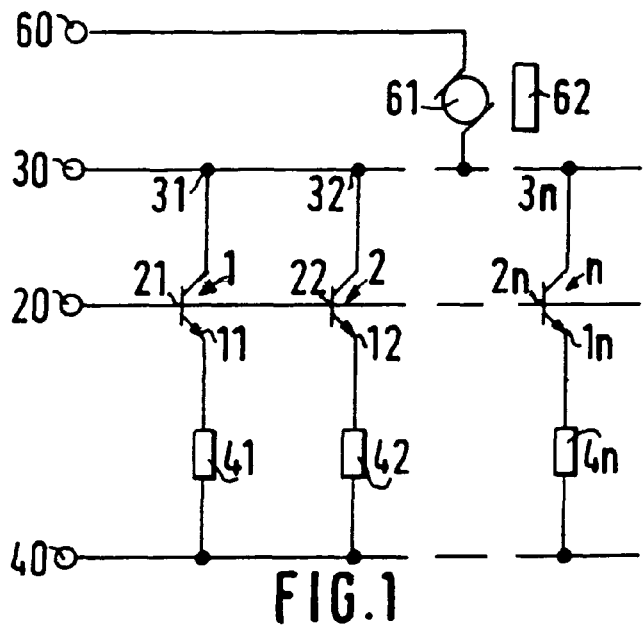
FIG. 1 shows a circuit diagram of a conventional power transistor having emitter resistors.

FIG. 1 shows a circuit diagram of a conventional power transistor that includes parallel-connected individual transistors 1, 2, . . . n having partial emitters 11, 12, . . . 1n, as well as bases 21, 22, . . . 2n and collectors 31, 32, . . . 3n. Collectors 31, 32, . . . 3n are all connected to collector terminal 30, bases 21, 22, . . . 2n are all connected to base terminal 20, and partial emitters 11, 12, . . . 1n are connected, via emitter resistors 41, 42, . . . 4n, to emitter terminal 40. In the example, collector terminal 30 is connected, using a direct-current motor as load, to an armature 61 and to a permanent field device 62, which is coupled to the positive pole of an application circuit. Emitter resistors 41, 42, . . . 4n are used to stabilize the current distribution over the individual transistors in order, given uniform current distribution over the individual transistors, to ensure a maximum total current through the application load (e.g., a direct-current motor).

Figure 2:
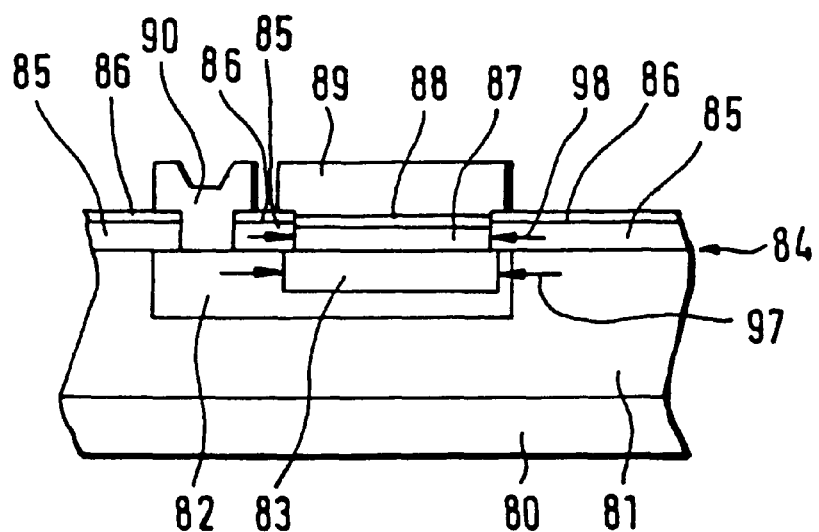
FIG. 2 shows a first embodiment of a section of the transistor component according to the present invention.

FIG. 2 shows a cut-away portion of an embodiment of the transistor component according to the present invention. Arranged on a substrate 80 or on a low-resistance buried layer is a high-resistance epitaxial layer 81, into which a base zone 82 is embedded. Embedded in turn in base zone 82 is a partial-emitter region 83 having a partial-emitter width 97. FIG. 2 shows only a cross-section through the transistor component. The partial-emitter region is formea as an elongated emitter finger, for example, as described in European Patent Application No. 0 397 727. A thermally grown oxide 85 is applied on a major plane 84. A further oxide 86 can be applied on the thermally grown oxide 85. Provision is made for cut-outs in the oxide layers for base electrode 90 electrically contacting base zone 82, as well as for emitter resistor 87, formed as an epitaxial resistive film, which has an ion-implanted area 88 in direct electrical contact with emitter-metal contact 89. In addition, emitter resistor 87 has an emitter-resistor width 98. Emitter resistor 87 represents the realization, according to the present invention, of one of emitter resistors 41, 42, . . . 4n shown in FIG. 1. Emitter resistor 87 is both in direct electrical and in direct thermal contact with partial-emitter region 83. This results in both an optimized stabilization of the current distribution over the individual partial-emitter regions of a power transistor, and an improvement in the current carrying capacity and the high-frequency properties, as well as further advantages as described above. In area 88, for example, the charge carrier density is increased by ion implantation, in order to ensure a contact, free of a barrier layer, to emitter-metal contact 89. In the embodiment shown in FIG. 2, emitter-resistor width 98 corresponds approximately to partial-emitter width 97, and emitter resistor 87 lies approximately congruently on partial-emitter region 83, in order to attain an optimal thermal and electrical contact to emitter resistor 87 in each partial region of partial-emitter region 83.

In one embodiment according to the present invention, emitter resistor 87 is configured as an epitaxial layer of suitable resistance having the conductivity type of the emitter. If the thickness of the epitaxial layer settles in the practicable range on the order of one micrometer (e.g., between 0.3 and 3 micrometers), its specific resistance and thus its doping can be estimated on the basis of the emitter current density of power transistors, and the requisite voltage of the negative feedback. With an emitter current density between $10^3$ and $10^5$ A/cm$^2$ and a requisite voltage for the negative feedback between 0.1 and 1 V, a range results for the specific resistance between $10^{-2}$ and 10 Ωcm. Thus, this range lies in a technically reasonable range with a doping concentration between $10^{15}$ and $10^{19}$ per square centimeter.

At a predetermined low enough temperature, the epitaxial intermediate layer thus doped can be produced using selective epitaxy. After applying thermally grown oxide 85 and further oxide 86, initially the oxide layers are etched away in the regions intended to be covered with an epitaxial layer, thus the region provided for the emitter resistor, as well. If, at this point, the surface of the emitter, or at least of partial-emitter region 83, is etched bare, but the remaining surface is poly-crystalline or amorphous, the deposition conditions can be modified, e.g., by adding HCl as etching medium to the gas of a deposition reactor, so that because of its higher bonding energy, only epitaxial layer 81 grows, while the developing polysilicon is continuously etched away. After applying the epitaxial resistor layer, in order to ensure a contact free of barrier layers, especially when using aluminum and its alloys as material for the emitter-metal contact, the surface of epitaxial resistor layer 87 is enriched with charge carriers, for example by implanting ions of the same conductivity type as the emitter, so that an ion-implanted area 88 is formed. A particularly low contact resistance can be achieved with this procedure.

Figure 3:
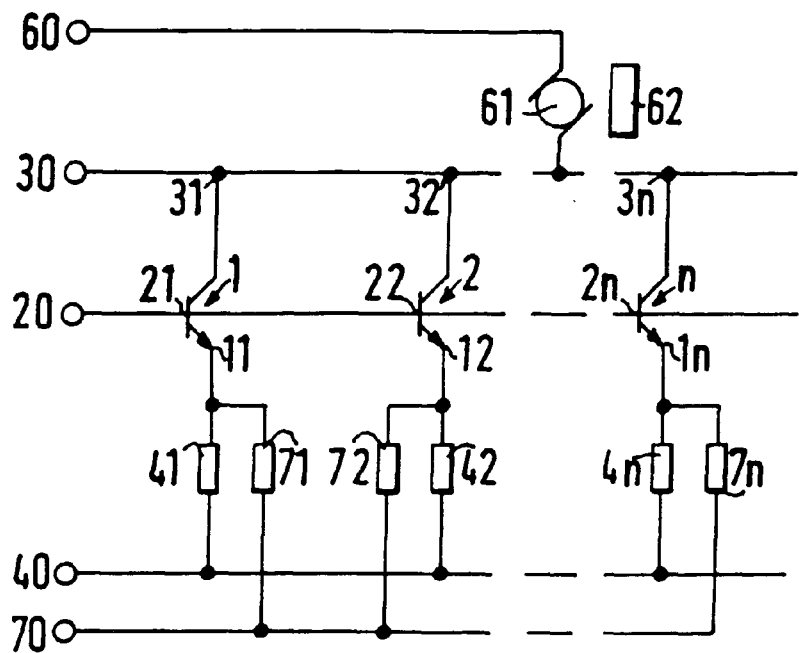
FIG. 3 shows a circuit diagram of a power transistor having emitter resistors and measuring resistors according to the present invention.

FIG. 3 shows a circuit diagram of a power transistor having emitter resistors allocated to the partial emitters, and measuring resistors 71, 72, . . . 7n allocated to them as well. Measuring resistors 71, 72, . . . 7n are connected to a joint decoupling line 70. The other terminal of each of decoupling (measuring) resistor 71, 72, . . . 7n is connected directly to the respective partial emitter of individual transistor 1, 2, . . . n allocated thereto. Decoupling resistors 71, 72, . . . 7n are used to obtain a measured variable proportional to the emitter resistance, without having to accept an additional voltage loss at a measuring resistor. In particular, decoupling resistors can be used to determine a voltage proportional to the emitter current so that information about the emitter current can be obtained without additional voltage loss. Such use of decoupling resistors as such is known.

Figure 4:
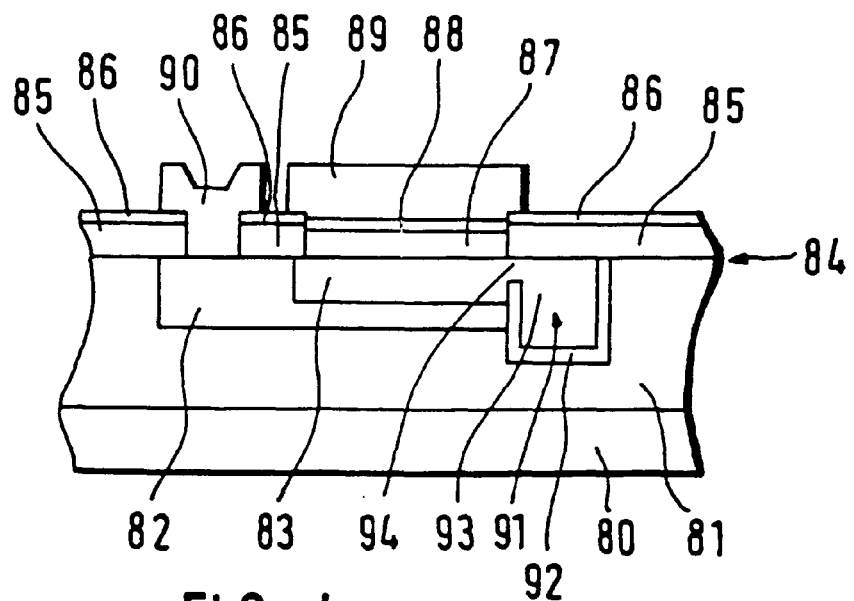
FIG. 4 shows a second embodiment of the transistor component according to the present invention having an integrated decoupling resistor.

FIG. 4 shows an illustration of the decoupling resistors according to the present invention. FIG. 4 differs from FIG. 2 due to an introduced lateral contacting 91, 92, 93, 94. FIG. 4 shows an exemplary illustration of a physical implementation of one of decoupling resistors 71, 72, . . . 7n. The sides of base zone 82 and of partial-emitter region 83 facing away from base electrode 90 are bounded by an etched trench 91 whose inner sides, with the exception of section 94 facing the partial-emitter region, are covered with an oxide layer 92, and which is filled with a conductive material 93, for instance polysilicon, of the same conductivity (and dopant) type as the partial-emitter region. The polysilicon of conductive material 93 is doped at the same time together with the emitter region. The trench itself, except for a contact region (not shown) which corresponds to decoupling line 70 in FIG. 3, is electrically insulated with respect to emitter resistor 87 and emitter-metal contact 89 by an oxide layer, likewise not shown in FIG. 4. A terminal electrode such as a pad electrode may be connected to the contact region.

The present invention is not limited to transistors as semiconductor components, but can also be applied to thyristors to further improve their triggering function in response to a steep current rise. Thus, an epitaxial resistor layer is then arranged between at least one of the main electrodes and the metal coating lying over it used as a contact, the temperature coefficient of the epitaxial resistor layer being advantageously $\geq 0$, i.e. only negligibly less than 0 here, as well.

What is claimed is:

1. A semiconductor component arranged on a substrate, comprising:
    an emitter region including:
        at least one partial-emitter region;
        an emitter-metal contact; and
        an emitter resistor coupled between the at least one partial-emitter region and the emitter-metal contact;
    a lateral contacting arrangement for detecting a voltage drop on the emitter resistor, wherein the lateral contacting arrangement includes:
        a first portion of a trench;
        a second portion of a trench;
        wherein the trench is filled with a conductive material;
        an oxide layer for electrically insulating the first portion, and
        wherein the lateral contacting arrangement is electrically coupled to the at least one partial-emitter region via the second portion.

2. The semiconductor component according to claim 1, wherein the emitter resistor has a non-negative temperature coefficient.

3. The semiconductor component according to claim 1, wherein the emitter resistor contacts the emitter-metal contact without an interference from a barrier layer.

4. The semiconductor component according to claim 1, wherein the emitter region includes an emitter of a silicon power transistor.

5. The semiconductor component according to claim 1,
    wherein the emitter region is doped with a first dopant,
    wherein the trench includes an electrical connection for electrically coupling the lateral contacting arrangement to the at least one partial emitter region, and
    wherein the electrical connection is doped with a second dopant, the first dopant being of the same type as the second dopant.

6. The semiconductor component according to claim 1, wherein the lateral contacting arrangement includes a pad electrode, and wherein the pad electrode electrically contacts the trench to a surface of the semiconductor component.

* * * * *